US012787406B2

(12) United States Patent
Saito et al.

(10) Patent No.: US 12,787,406 B2
(45) Date of Patent: Nov. 3, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Keita Saito, Nonoichi Ishikawa (JP); Kouta Tomita, Nonoichi Ishikawa (JP); Tatsuya Nishiwaki, Yokohama Kanagawa (JP); Yasunobu Saito, Nomi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 756 days.

(21) Appl. No.: 18/084,484

(22) Filed: Dec. 19, 2022

(65) Prior Publication Data

US 2024/0096973 A1 Mar. 21, 2024

(30) Foreign Application Priority Data

Sep. 16, 2022 (JP) ................................ 2022-147834

(51) Int. Cl.
*H10D 64/00* (2025.01)
*H10D 30/66* (2025.01)
(Continued)

(52) U.S. Cl.
CPC ......... *H10D 64/117* (2025.01); *H10D 30/668* (2025.01); *H10D 64/519* (2025.01); *H10W 20/43* (2026.01)

(58) Field of Classification Search
CPC .. H10D 64/117; H10D 64/519; H10D 30/668; H10W 20/43
See application file for complete search history.

(56) References Cited

U.S. PATENT DOCUMENTS 9,299,830 B1 * 3/2016 Kawahara ............ H10D 30/668
9,455,205 B2 * 9/2016 Zundel .................. H10P 74/207
(Continued)

FOREIGN PATENT DOCUMENTS

JP 2015-023166 A 2/2015
JP 2019-009258 A 1/2019
(Continued)

OTHER PUBLICATIONS

Office Action issued in Japanese Patent Application No. 2022-147834, dated Jul. 11, 2025 in 8 pages.

*Primary Examiner* — Joseph C. Nicely
(74) *Attorney, Agent, or Firm* — Knobbe, Martens, Olson & Bear, LLP

(57) ABSTRACT

A semiconductor device includes: a first electrode; a semiconductor part located on the first electrode; a second electrode located in a first region on the semiconductor part; a third electrode located in a second region on the semiconductor part; an insulating member located in the semiconductor part in the first and second regions; a fourth electrode located in the insulating member in the first and second regions; a fifth electrode located in the insulating member between the first electrode and the fourth electrode in the first and second regions; and a conductive member located at least in the second region. The conductive member is connected to the third, fourth, and fifth electrodes.

10 Claims, 12 Drawing Sheets

(51) Int. Cl.

*H10D 64/27* (2025.01)
*H10W 20/43* (2026.01)

(56) References Cited

U.S. PATENT DOCUMENTS

| | | | | |
|---|---|---|---|---|
| 11,239,357 | B2 | 2/2022 | Nishiwaki et al. | |
| 11,276,775 | B2 | 3/2022 | Ichinoseki et al. | |
| 11,664,448 | B2 * | 5/2023 | Shinoda | H10D 30/668 257/330 |
| 2002/0030237 | A1 * | 3/2002 | Omura | H10D 30/66 257/E21.345 |
| 2002/0100923 | A1 * | 8/2002 | Lanzerstorfer | H10D 30/668 257/329 |
| 2008/0135930 | A1 * | 6/2008 | Saito | H10D 62/111 257/330 |
| 2011/0204436 | A1 * | 8/2011 | Kraft | H10D 30/668 257/330 |
| 2013/0248992 | A1 * | 9/2013 | Padmanabhan | H10D 30/668 438/270 |
| 2014/0070852 | A1 * | 3/2014 | Saito | H10D 64/117 327/109 |
| 2016/0268423 | A1 * | 9/2016 | Koepp | H10D 84/839 |
| 2017/0263699 | A1 * | 9/2017 | Kobayashi | H10D 64/112 |
| 2017/0263768 | A1 * | 9/2017 | Katoh | H10D 30/63 |
| 2018/0374950 | A1 | 12/2018 | Kobayashi | |
| 2019/0198660 | A1 | 6/2019 | Kachi | |
| 2020/0227537 | A1 * | 7/2020 | Li | H10D 30/0297 |
| 2021/0288177 | A1 | 9/2021 | Nishiwaki et al. | |
| 2021/0367071 | A1 | 11/2021 | Shinoda et al. | |
| 2022/0052171 | A1 * | 2/2022 | Buth | H10D 64/513 |
| 2022/0173215 | A1 * | 6/2022 | Zeng | H10D 30/0297 |
| 2023/0420556 | A1 * | 12/2023 | Abiko | H10D 30/668 |

FOREIGN PATENT DOCUMENTS

| | | | |
|---|---|---|---|
| JP | 2019-114643 | A | 7/2019 |
| JP | 2020-150200 | A | 9/2020 |
| JP | 2021-034540 | A | 3/2021 |
| JP | 2021-145122 | A | 9/2021 |
| JP | 2021-184443 | A | 12/2021 |

* cited by examiner

SEMICONDUCTOR DEVICE

CROSS-REFERENCE TO RELATED APPLICATIONS

This application is based upon and claims the benefit of priority from Japanese Patent Application No. 2022-147834, filed on Sep. 16, 2022; the entire contents of which are incorporated herein by reference.

FIELD

Embodiments relate to a semiconductor device.

BACKGROUND

Trench-gate MOSFETs are used as semiconductor devices for power control. In such a semiconductor device, a field plate electrode (hereinbelow, called a "FP electrode") may be provided below the trench gate to relax electric field concentration in the off-state and increase the source-drain breakdown voltage. On the other hand, in a semiconductor device for power control, it is desirable to reduce the source-drain resistance (hereinbelow, called the "on-resistance") in the on-state as much as possible.

DETAILED DESCRIPTION

In general, according to one embodiment, a semiconductor device includes: a first electrode; a semiconductor part located on the first electrode; a second electrode located in a first region on the semiconductor part; a third electrode located in a second region on the semiconductor part; an insulating member located in the semiconductor part in the first and second regions; a fourth electrode located in the insulating member in the first and second regions; a fifth electrode located in the insulating member between the first electrode and the fourth electrode in the first and second regions; and a conductive member located at least in the second region. The conductive member is connected to the third, fourth, and fifth electrodes.

First Embodiment

Figure 1:
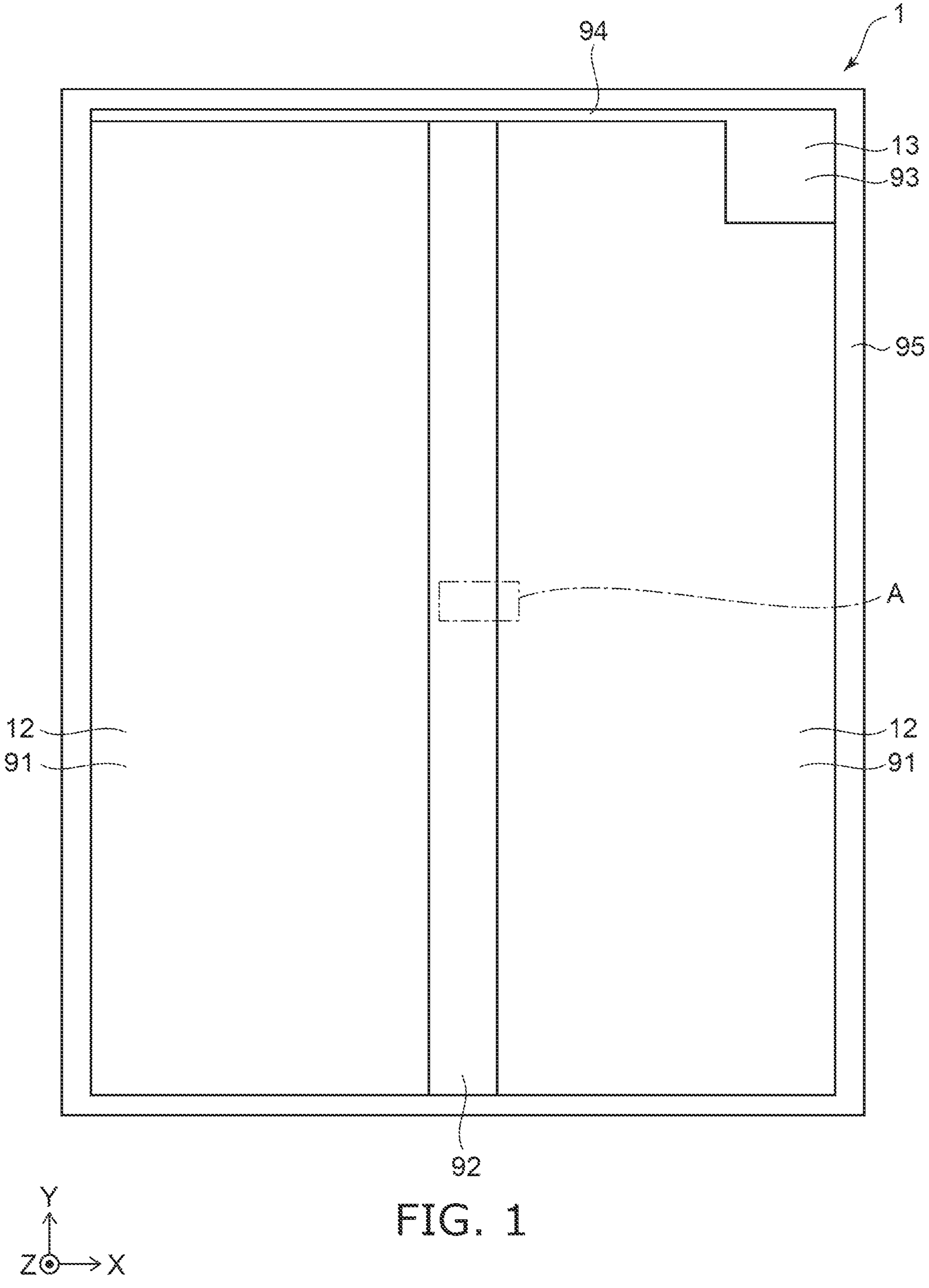
FIG. 1 is a top view showing a semiconductor device according to a first embodiment.

FIG. 1 is a top view showing a semiconductor device according to the embodiment.

Figure 2:
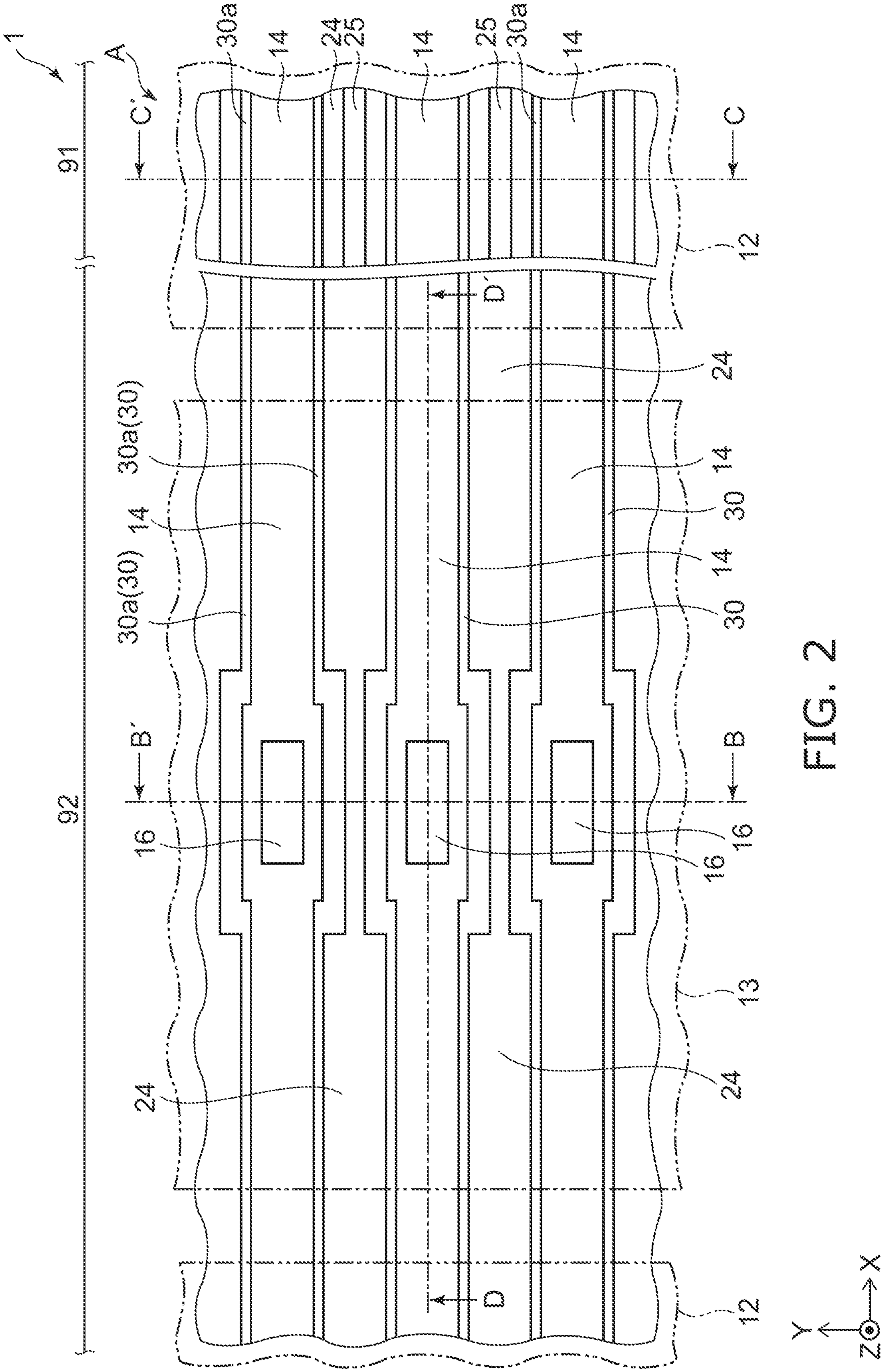
FIG. 2 is a partially enlarged top view showing region A of FIG. 1.

FIG. 2 is a partially enlarged top view showing region A of FIG. 1.

Figure 3:
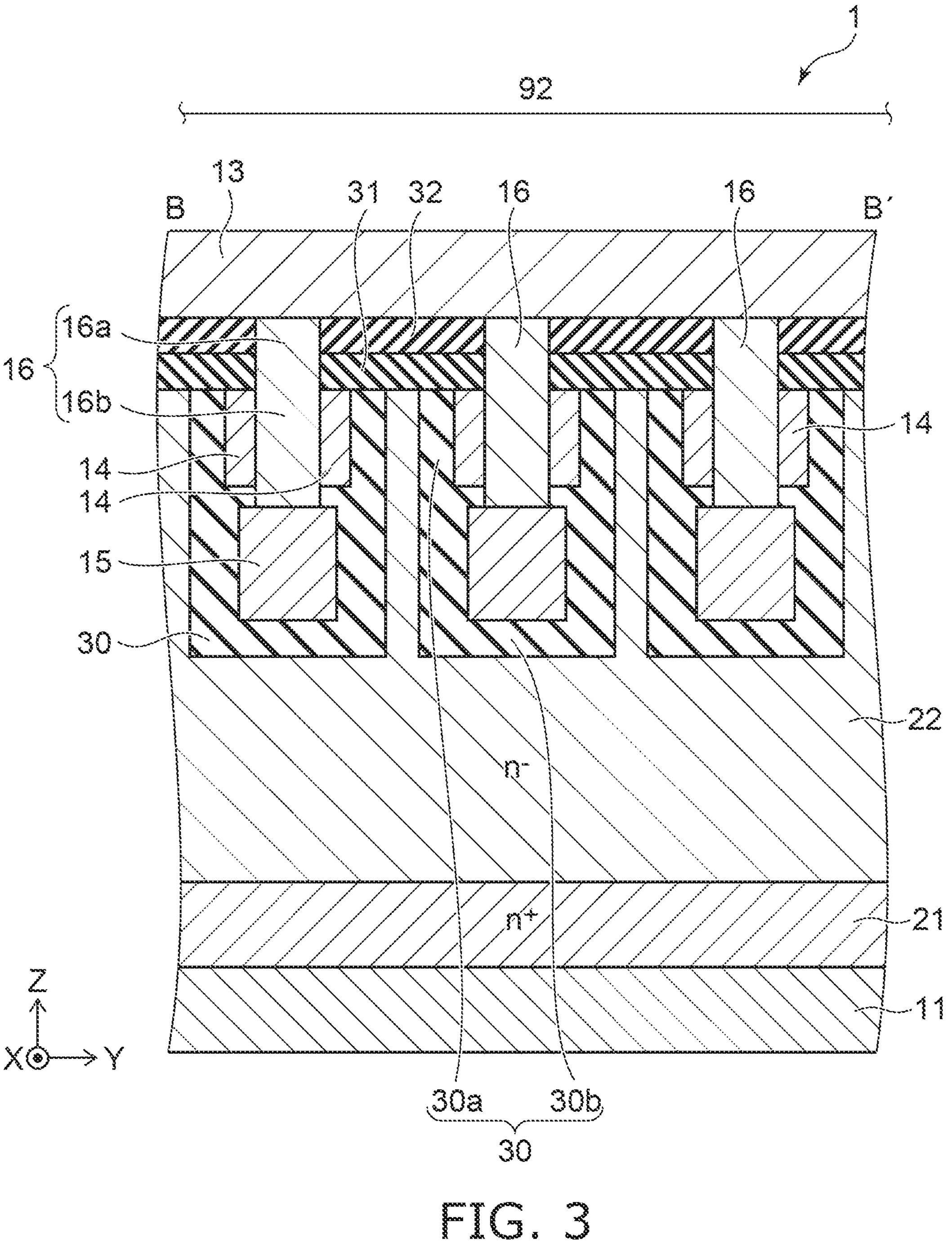
FIG. 3 is a cross-sectional view along line B-Br shown in FIG. 2.

FIG. 3 is a cross-sectional view along line B-B' shown in FIG. 2.

Figure 4:
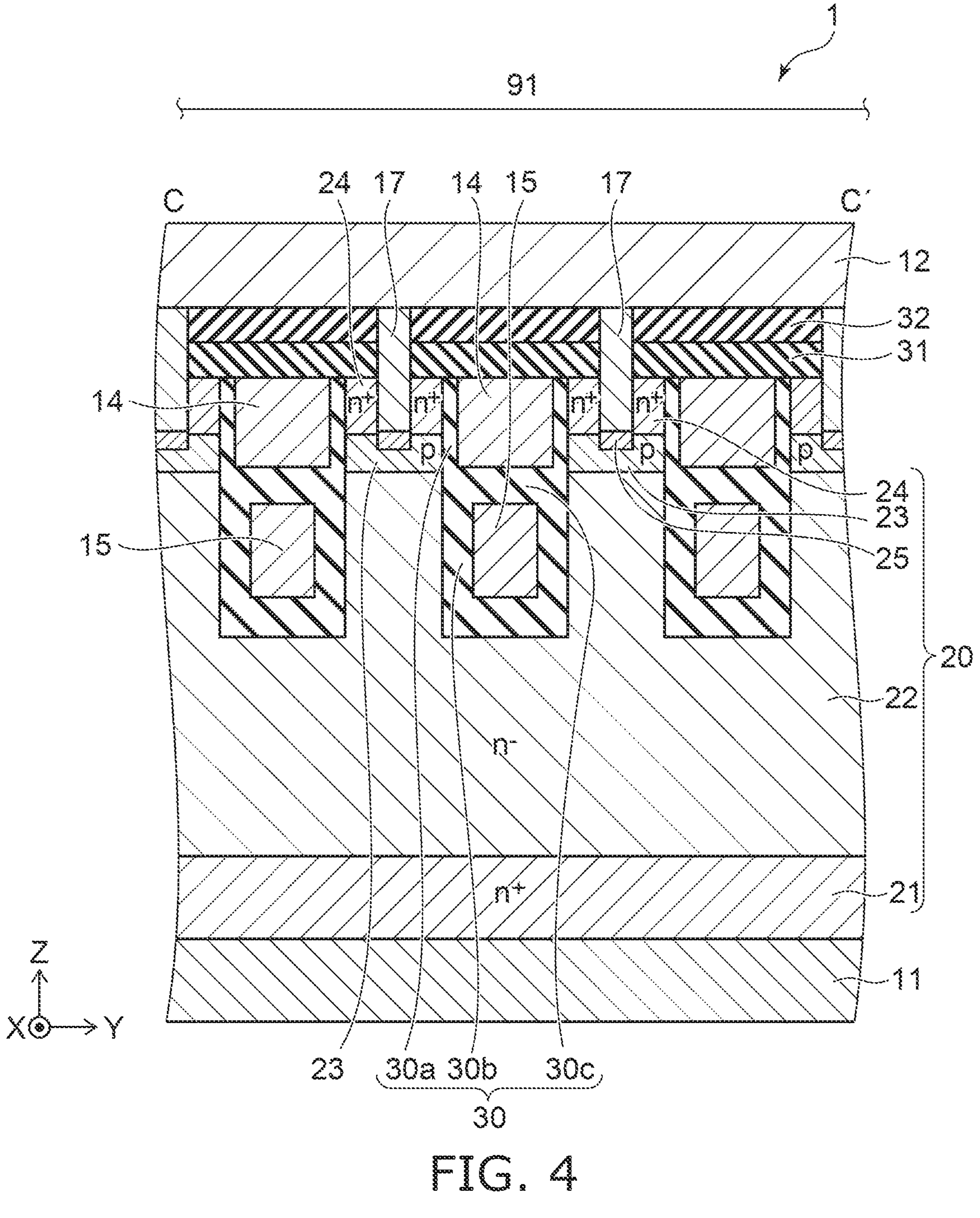
FIG. 4 is a cross-sectional view along line C-C' shown in FIG. 2.

FIG. 4 is a cross-sectional view along line C-C shown in FIG. 2.

Figure 5:
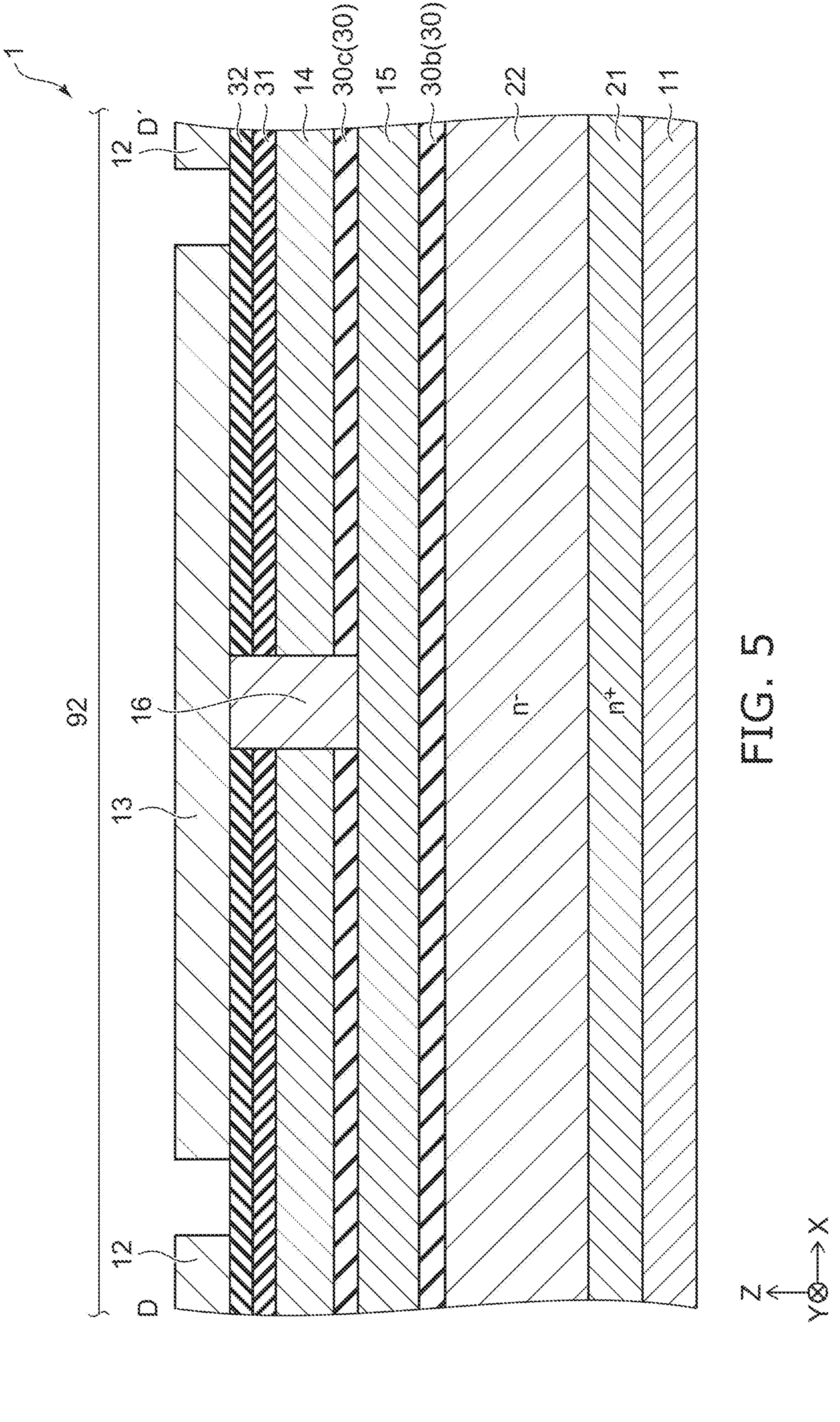
FIG. 5 is a cross-sectional view along line D-D' shown in FIG. 2.

FIG. 5 is a cross-sectional view along line D-D' shown in FIG. 2.

The drawings are schematic or conceptual, and are simplified or enhanced as appropriate. Furthermore, the dimensions and proportional coefficients may be illustrated differently among drawings, even for identical portions. This is similar for the other drawings described below as well.

As shown in FIGS. 1 to 5, the semiconductor device 1 according to the embodiment includes a drain electrode 11, a source electrode 12, a gate interconnect 13, multiple gate electrodes 14, multiple FP (field plate) electrodes 15, multiple conductive members 16, multiple source contacts 17, a semiconductor part 20, multiple insulating members 30, an insulating film 31, and an insulating film 32. In FIG. 2, the insulating films 31 and 32 are not illustrated, and the source electrode 12 and the gate interconnect 13 are shown by double dot-dash lines. This is similar for similar top views below as well.

In the specification hereinbelow, an XYZ orthogonal coordinate system is employed for convenience of description. The arrangement direction of the drain electrode 11 and the source electrode 12 is taken as a "Z-direction"; the arrangement direction of the multiple gate electrodes 14 is taken as a "Y direction"; and the direction in which the gate electrodes 14 extend is taken as an "X-direction". Among the Z-directions, a direction that is from the drain electrode 11 toward the source electrode 12 also is called "up", and the opposite direction also is called "down", but these expressions are for convenience and are independent of the direction of gravity.

The semiconductor device 1 includes a cell region 91 (a first region), a finger region 92 (a second region), a gate pad region 93, a linking region 94, and a termination region 95. The regions described above are set in the XY plane. The frame-shaped termination region 95 is located in the outer perimeter portion of the semiconductor device 1 when viewed from above. The cell region 91, the finger region 92, the gate pad region 93, and the linking region 94 are located in a rectangular region surrounded with the termination region 95. The finger region 92 is located at the X-direction central portion of the rectangular region and substantially extends through the rectangular region in the Y-direction. The gate pad region 93 is located at one corner of the rectangular region surrounded with the termination region 95. The linking region 94 is located along the inner edge of the termination region 95 to link the finger region 92 to the gate pad region 93. The linking region 94 is connected to one Y-direction end portion of the finger region 92 and one X-direction end portion of the gate pad region 93.

The cell region 91 is located in the region of the rectangular region surrounded with the termination region 95 other than the finger region 92, the gate pad region 93, and the linking region 94 and occupies the greater part of the semiconductor device 1 when viewed along the Z-direction. Two cell regions 91 are set and are located at the two X-direction sides of the finger region 92. In other words, the finger region 92 is located between the two cell regions 91. The positional relationship of the cell region 91, the finger region 92, the gate pad region 93, and the linking region 94 is not limited thereto.

The drain electrode 11 (a first electrode) is made of, for example, a metal, has a plate shape, and is provided over the entire lower surface or substantially the entire lower surface of the semiconductor device 1.

The semiconductor part 20 is located on the drain electrode 11. The semiconductor part 20 is made of a semiconductor material and is made of, for example, single-crystal silicon (Si). As described below, the semiconductor part 20 locally includes impurities; and the conductivity types of the portions are provided thereby.

The insulating film 31 is located on the semiconductor part 20. The insulating film 31 is made of, for example, silicon oxide (SiO). The insulating film 32 is located on the insulating film 31. The insulating film 32 is made of, for example, BPSG (boron phosphorous silicate glass).

The source electrode 12 (a second electrode) and the gate interconnect 13 (a third electrode) are located on the insulating film 32. The source electrode 12 is located in the cell region 91 of the semiconductor device 1. The gate interconnect 13 is located in the finger region 92, the gate pad region 93, and the linking region 94 of the semiconductor device 1. The portion of the gate interconnect 13 located in the finger region 92 is an interconnect extending in the Y-direction. The portion of the gate interconnect 13 located in the gate pad region 93 is a rectangular pad and functions as a gate pad. The portion of the gate interconnect 13 located in the linking region 94 is an interconnect extending in the X-direction.

The multiple insulating members 30 are located in the semiconductor part 20. The multiple insulating members 30 are periodically arranged along the Y-direction; and each insulating member 30 extends in the X-direction. For example, the insulating member 30 is formed of an insulating material such as silicon oxide, etc. The upper surface of the insulating member 30 is exposed at the upper surface of the semiconductor part 20.

The gate electrode 14 (a fourth electrode) is located in the upper portion in the insulating member 30 and extends in the X-direction. For example, one gate electrode 14 is located in one insulating member 30. In the semiconductor device 1 as an entirety, the multiple gate electrodes 14 are arranged along the Y-direction. The gate electrodes 14 are formed of a conductive material, e.g., polysilicon that includes an impurity.

The FP electrode 15 (a fifth electrode) is located in the lower portion inside the insulating member 30 and extends in the X-direction. In other words, the FP electrode 15 is located between the drain electrode 11 and the gate electrode 14 inside the insulating member 30. For example, one FP electrode 15 is located inside one insulating member 30. In the semiconductor device 1 as an entirety, the multiple FP electrodes 15 are arranged along the Y-direction. The FP electrodes 15 are formed of a conductive material, e.g., polysilicon that includes an impurity.

Each insulating member 30, as well as the gate electrode 14 and the FP electrode 15 located inside each insulating member 30, are provided across substantially the entire semiconductor device 1 in the X-direction and are provided over the two cell regions 91 and the finger region 92 between the two cell regions 91. The widths, i.e., the Y-direction lengths, of the insulating member 30, the gate electrode 14, and the FP electrode 15 in the finger region 92 are greater than their widths in the cell region 91.

The semiconductor part 20 includes an $n^+$-type drain layer 21, an $n^-$-type drift layer 22, a p-type base layer 23, an $n^+$-type source layer 24, and a $p^+$-type contact layer 25. The "$n^+$-type" refers to a higher carrier concentration than the "n type"; and the "$p^+$-type" refers to a higher carrier concentration than the "p-type". The "carrier concentration" is the effective impurity concentration functioning as a donor or an acceptor.

The drain layer 21 contacts the drain electrode 11 and is connected to the drain electrode 11. In the specification, "connected" refers to an electrical connection. The drift layer 22 is located on the drain layer 21 and contacts the drain layer 21. A first semiconductor layer includes the drain layer 21 and the drift layer 22. The base layer 23 (a second semiconductor layer) is located on the drift layer 22 and contacts the drift layer 22. The source layer 24 (a third semiconductor layer) is located on a portion of the base layer 23. The contact layer 25 is located on another portion of the base layer 23. The base layer 23, the source layer 24, and the contact layer 25 are located in the cell region 91 but not located in the finger region 92. The base layer 23 may be located in the finger region 92.

As described above, the source electrode 12 is located in the cell region 91. In the cell region 91, the source layer 24 and the contact layer 25 are connected to the source electrode 12 via the source contact 17. The source contact 17 extends in the Z-direction and extends through the insulating film 32, the insulating film 31, and the source layer 24; the upper end of the source contact 17 contacts the lower surface of the source electrode 12; and the lower end of the source contact 17 contacts the upper surface of the contact layer 25.

A portion of the gate interconnect 13 is located in the finger region 92. The conductive member 16 is located in the finger region 92. One conductive member 16 is provided for one gate electrode 14 and one FP electrode 15 located in one insulating member 30. In the semiconductor device 1 as an entirety, the multiple conductive members 16 are arranged in one column along the Y-direction. According to the embodiment, the conductive member 16 is not located in the cell region 91.

The conductive member 16 is made of a conductive material, e.g., a metal, and is, for example, a stacked body in which a titanium layer, a titanium nitride layer, and a tungsten layer are stacked. The conductive member 16 is, for example, a gate contact extending in the Z-direction. An upper portion **16*a* of the conductive member 16 is located in the insulating films 31 and 32 and extends through the insulating films 31 and 32 in the Z-direction. A lower portion 16*b* of the conductive member 16 is located in the insulating member 30. The upper end of the conductive member 16 contacts the lower surface of the gate interconnect 13. The lower end of the conductive member 16 contacts the upper surface of the FP electrode 15. The conductive member 16 contacts the gate electrode 14 by extending through the gate electrode 14 in the Z-direction. Thereby, the conductive member 16 is connected to the gate interconnect 13, the gate electrode 14, and the FP electrode 15**.

In the finger region 92, the gate interconnect 13 includes one interconnect extending in the Y-direction. Then, the gate interconnect 13 is connected to all of the conductive members 16 arranged along the Y-direction. Thereby, the gate interconnect 13 is connected to all of the gate electrodes 14 and all of the FP electrodes 15 via the conductive members 16.

The gate electrode 14 faces the base layer 23 and the source layer 24 via a portion 30*a* of the insulating member 30. The portion 30*a* of the insulating member 30 forms the side surface of the upper portion of the insulating member 30 and functions as a gate insulating layer. The upper surface of the gate electrode 14 contacts the insulating film 31. The FP electrode 15 faces the drift layer 22 via a portion 30*b* of the insulating member 30. The portion 30*b* of the insulating member 30 forms the side surface and lower surface of the lower portion of the insulating member 30. A portion 30*c* of the insulating member 30 is interposed between the gate electrode 14 and the FP electrode 15. Accordingly, the gate electrode 14 is separated from the FP electrode 15 by the portion 30*c* in the finger region 92.

Such a configuration forms a vertical MOSFET in the cell region 91. In the finger region 92, the gate electrode 14 and the FP electrode 15 are connected to the gate interconnect 13. The gate interconnect 13 is connected to the outside of the semiconductor device 1 in the gate pad region 93.

Effects of the semiconductor device 1 according to the embodiment will now be described.

A voltage is applied between the drain electrode 11 and the source electrode 12 so that the drain electrode 11 is positive and the source electrode 12 is negative. For example, a ground potential is applied to the source electrode 12; and a prescribed positive potential is applied to the drain electrode 11. Accordingly, a depletion layer spreads with the interface between the $n^-$-type drift layer 22 and the p-type base layer 23 as a starting point.

When a gate potential that is not less than the MOSFET threshold is applied to the gate interconnect 13 in this state, the gate potential is conducted to the gate electrode 14 via the conductive member 16. Thereby, an inversion layer is formed in the portion of the base layer 23 contacting the portion 30*a* of the insulating member 30. As a result, the semiconductor device 1 is set to the on-state; and a current flows in the path of the drain electrode 11, the drain layer 21, the drift layer 22, the inversion layer of the base layer 23, the source layer 24, the source contact 17, and the source electrode 12. In the on-state, the potential difference between the drain electrode 11 and the source electrode 12 is small, and therefore the voltage applied to the semiconductor part 20 also is small, and the breakdown voltage is not a problem.

On the other hand, when a gate potential that is less than the MOSFET threshold, e.g., the ground potential, is applied to the gate interconnect 13, the inversion layer of the base layer 23 disappears, and the semiconductor device 1 is switched to the off-state. In the off-state, the potential difference between the drain electrode 11 and the source electrode 12 becomes large, and a high voltage is applied to the semiconductor part 20. Therefore, by applying a constant potential, e.g., the ground potential, to the FP electrode 15, the electric field concentration in the semiconductor part 20 can be relaxed, and the breakdown voltage can be increased.

Thus, when the semiconductor device 1 is in the off-state, the same potential can be applied to the gate electrode 14 and the FP electrode 15. According to the embodiment, by providing the conductive member 16 in the finger region 92 and by connecting the conductive member 16 to the gate interconnect 13, the gate electrode 14, and the FP electrode 15, the same potential can be applied to the gate electrode 14 and the FP electrode 15 at one location of the finger region 92. Accordingly, in the semiconductor device 1, it is unnecessary to separately provide a finger region for the gate electrode supplying the potential to the gate electrode 14 and a finger region for the FP electrode supplying the potential to the FP electrode 15. The cell region 91 can be widened thereby, and the on-resistance of the semiconductor device 1 can be reduced.

Comparative Example

Figure 6:
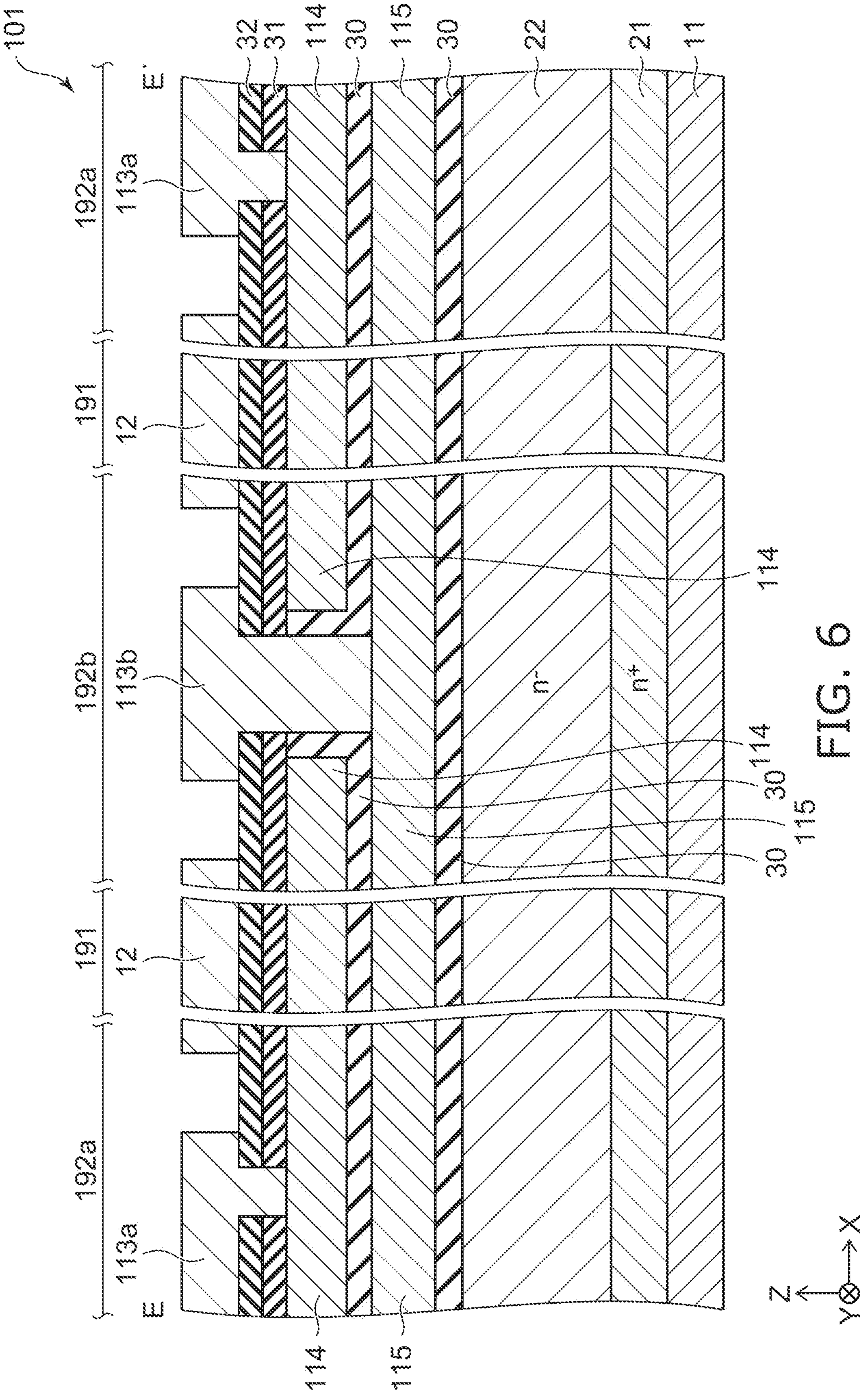
FIG. 6 is a cross-sectional view showing a semiconductor device according to a comparative example.

FIG. 6 is a cross-sectional view showing a semiconductor device according to a comparative example.

In the semiconductor device 101 according to the comparative example as shown in FIG. 6, gate finger regions 192*a* are set in two locations; and a FP finger region 192*b* is set in one location. A gate interconnect 113*a* is located in the gate finger region 192*a* and connected to a gate electrode 114. A FP interconnect 113*b* is located in the FP finger region 192*b* and connected to a FP electrode 115. Thus, in the semiconductor device 101, potentials can be independently applied to the gate electrode 114 and the FP electrode 115. However, because the gate finger region 192*a* and the FP finger region 192*b* are set, a cell region 191 is undesirably narrower. The on-resistance is high.

Second Embodiment

Figure 7:
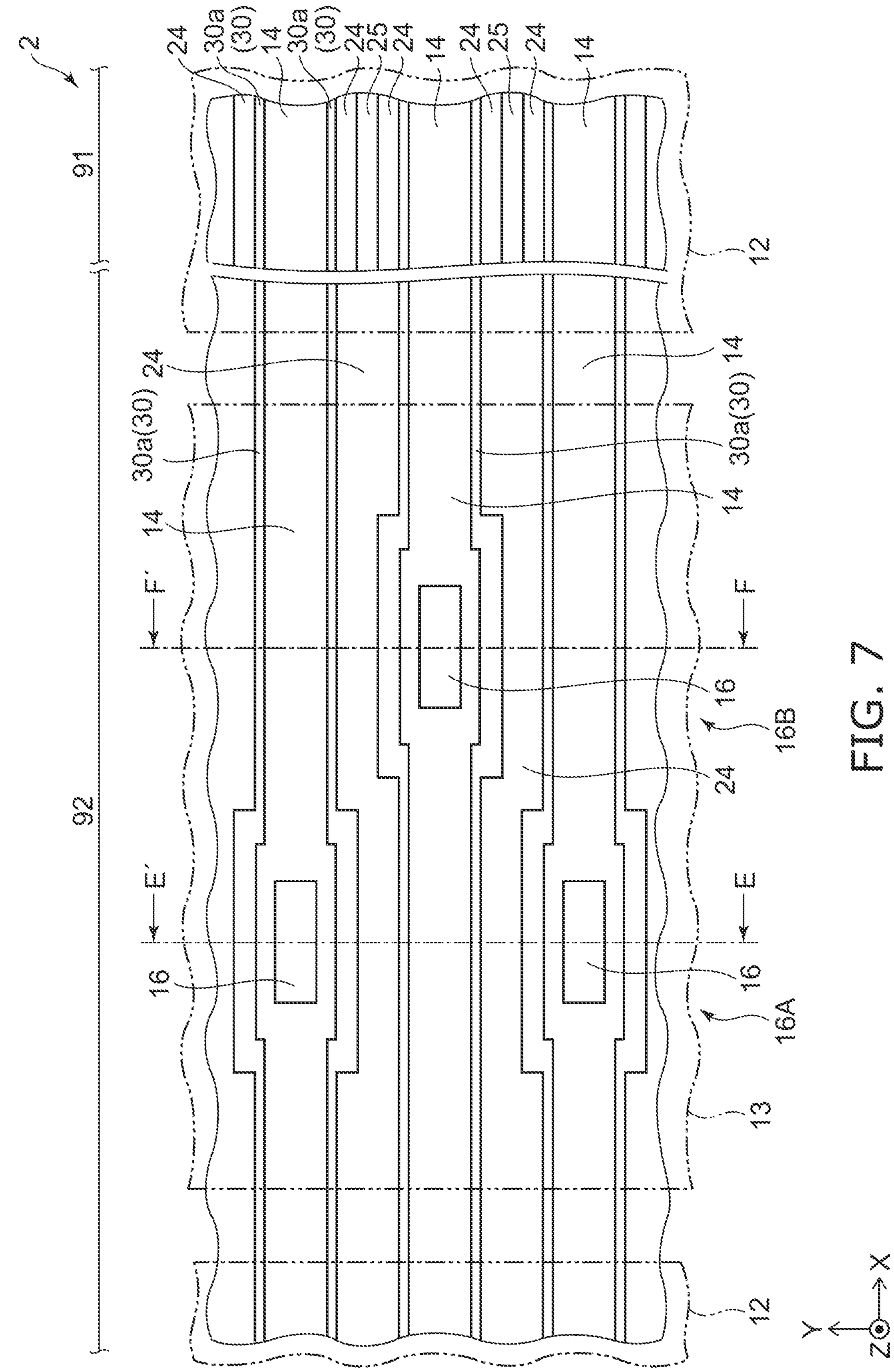
FIG. 7 is a partially enlarged top view showing a semiconductor device according to a second embodiment.

FIG. 7 is a partially enlarged top view showing a semiconductor device according to the embodiment.

Figure 8A:
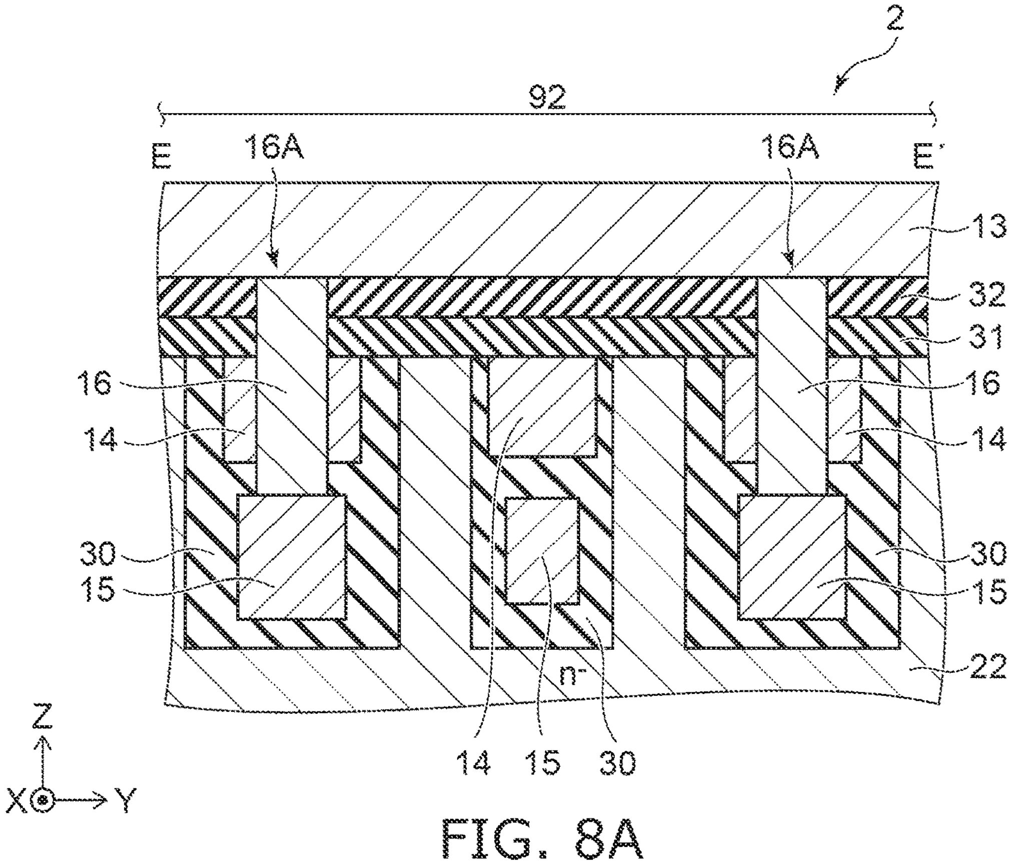
FIG. 8A is a cross-sectional view along line E-E' shown in FIG. 7.
Figure 8B:
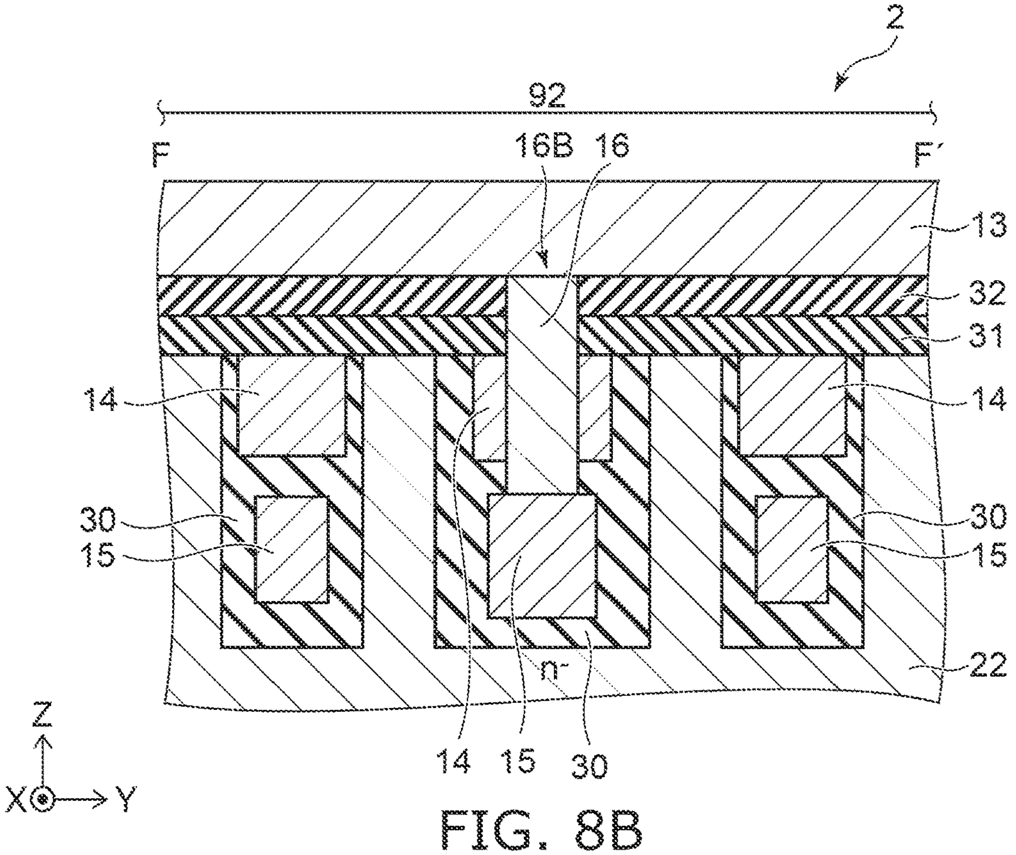
FIG. 8B is a cross-sectional view along line F-F' shown in FIG. 7.

FIG. 8A is a cross-sectional view along line E-E' shown in FIG. 7; and FIG. 8B is a cross-sectional view along line F-F' shown in FIG. 7.

FIGS. 8A and 8B show only the upper portion of the semiconductor device.

In the semiconductor device 2 according to the embodiment as shown in FIG. 7 and FIGS. 8A and 8B, the multiple conductive members 16 are alternately dispersed in two columns, i.e., a column 16A and a column 16B, that extend in the Y-direction. In other words, when viewed along the Z-direction, the conductive members 16 are alternately arranged in the columns 16A and 16B. Therefore, the two conductive members 16 connected to two gate electrodes 14 next to each other in the Y-direction are located at different X-direction positions.

According to the embodiment, by alternately locating the conductive members 16, the X-direction positions of the conductive members 16 can be shifted between the insulating members 30 that are next to each other in the Y-direction. The Y-direction arrangement period of the insulating members 30 can be shortened thereby. As a result, the channel width of the semiconductor device 2 can be increased, and the on-resistance can be reduced even further. Otherwise, the configuration and the effects of the embodiment are similar to those of the first embodiment.

Third Embodiment

Figure 9:
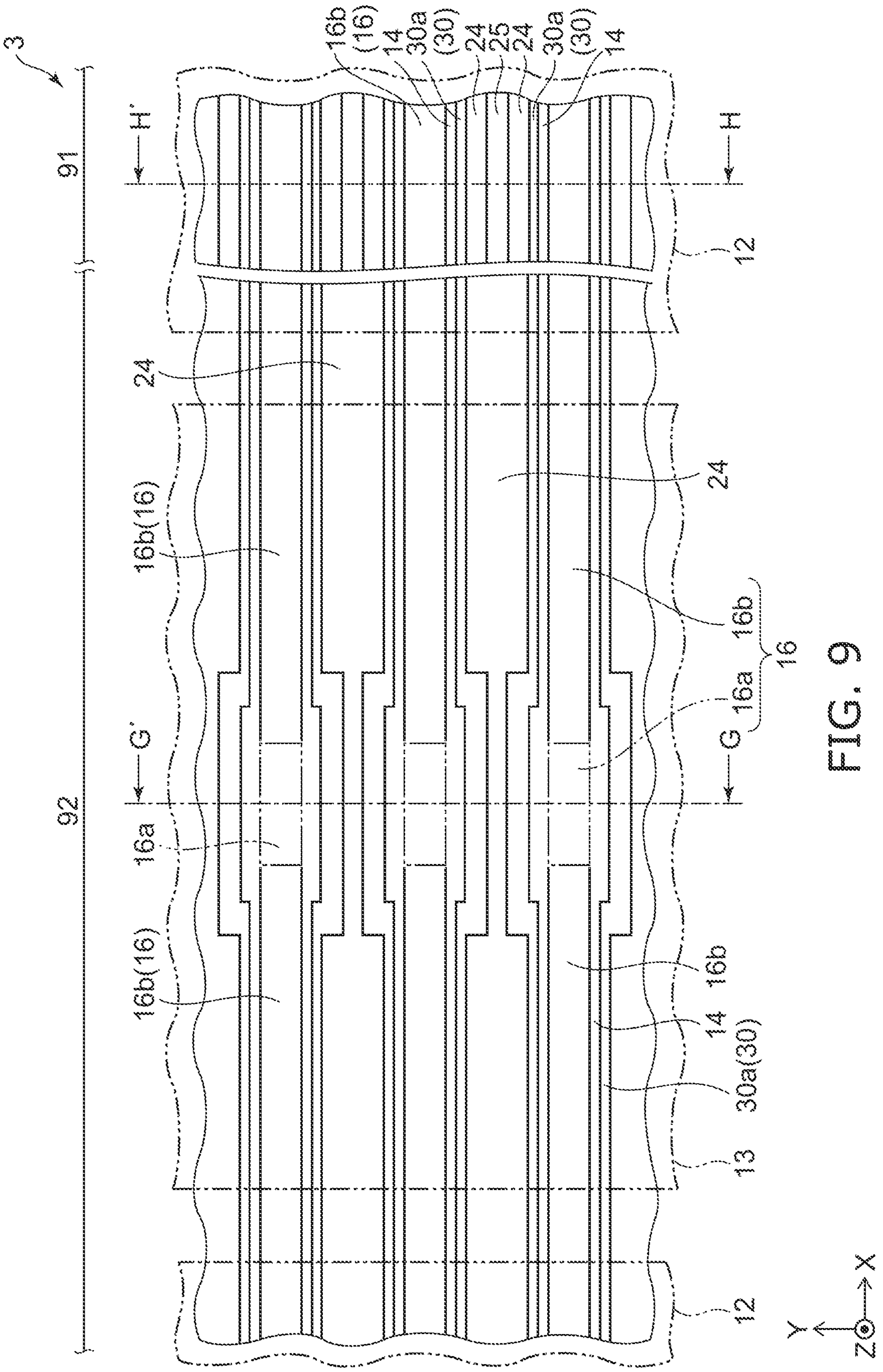
FIG. 9 is a partially enlarged top view showing a semiconductor device according to a third embodiment.

FIG. 9 is a partially enlarged top view showing a semiconductor device according to the embodiment.

Figure 10A:
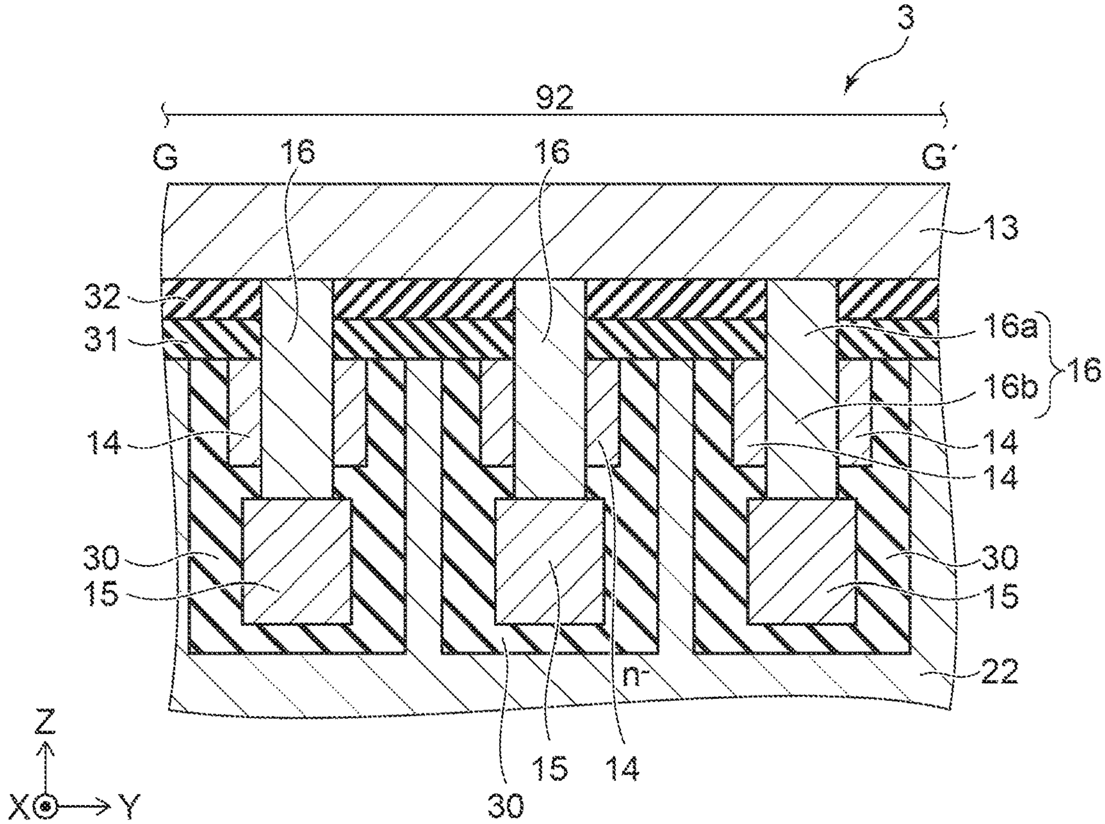
FIG. 10A is a cross-sectional view along line G-G' shown in FIG. 9.
Figure 10B:
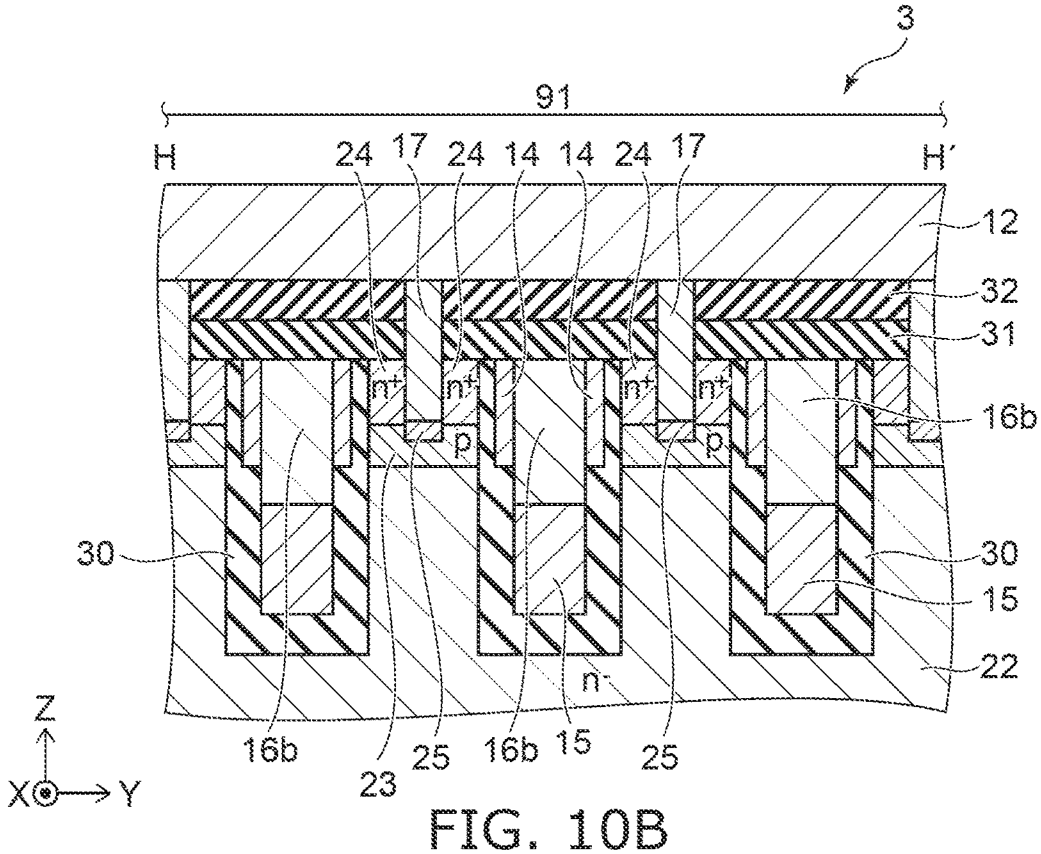
FIG. 10B is a cross-sectional view along line H-H' shown in FIG. 9.

FIG. 10A is a cross-sectional view along line G-G' shown in FIG. 9; and FIG. 10B is a cross-sectional view along line H-H' shown in FIG. 9.

FIGS. 10A and 10B show only the upper portion of the semiconductor device.

In the semiconductor device 3 according to the embodiment as shown in FIG. 9 and FIGS. 10A and 10B, the lower portion 16*b* of each conductive member 16 extends in the X-direction; and the lower portion 16*b* of each conductive member 16 also is located in the cell region 91 when viewed along the Z-direction. On the other hand, the upper portion 16*a* of each conductive member 16 is located only in the finger region 92. As described above, the lower portion 16*b* of the conductive member 16 is the portion located inside the insulating member 30; and the upper portion 16*a* is the portion located in the insulating film 31 and in the insulating film 32.

Thereby, the width-direction central portion, i.e., the Y-direction central portion, of the gate electrode 14 is made of the lower portion 16*b* of the conductive member 16. Similarly to the first embodiment, the two width-direction side portions, i.e., the two Y-direction side portions, of the gate electrode 14 include polysilicon.

According to the embodiment, the resistance of the gate electrode 14 can be reduced by the width-direction central portion of the gate electrode 14 being made of the lower portion 16*b* of the conductive member 16. Otherwise, the configuration and the effects of the embodiment are similar to those of the first embodiment.

Fourth Embodiment

Figure 11:
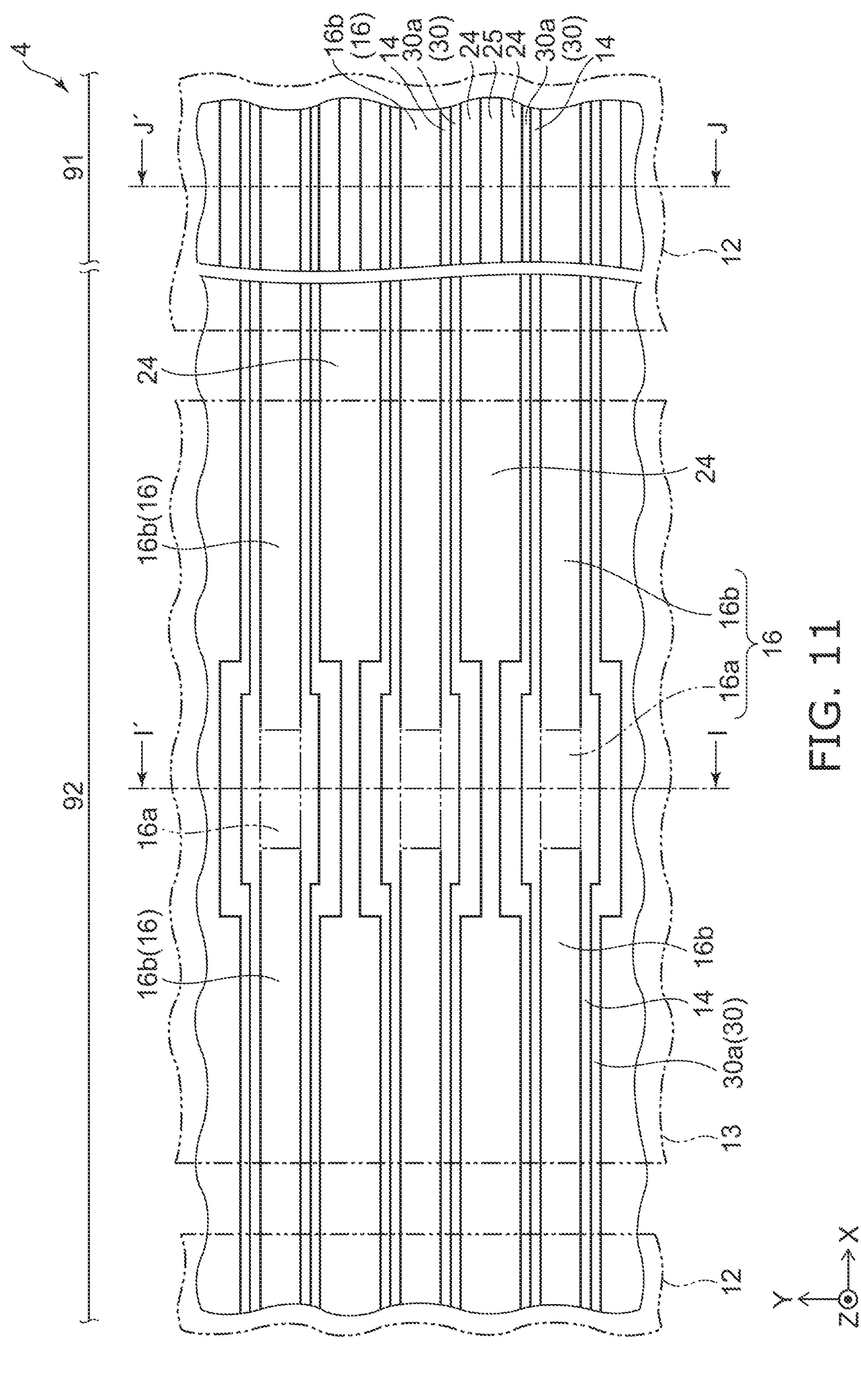
FIG. 11 is a partially enlarged top view showing a semiconductor device according to a fourth embodiment.

FIG. 11 is a partially enlarged top view showing a semiconductor device according to the embodiment.

Figure 12A:
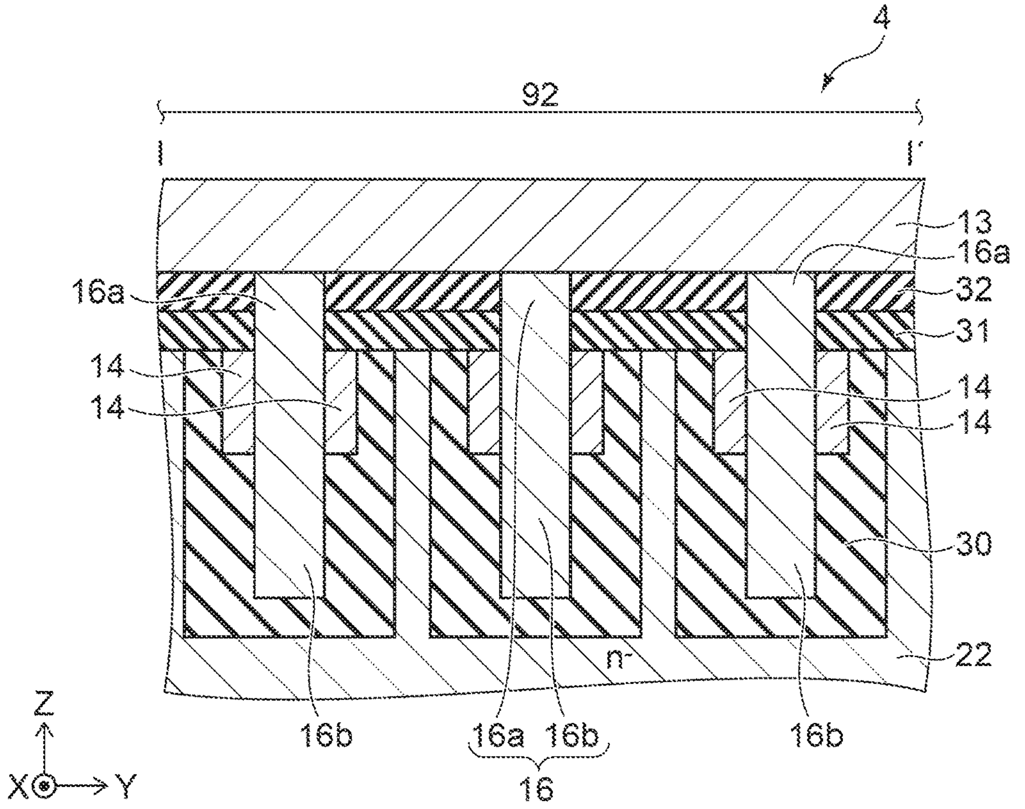
FIG. 12A is a cross-sectional view along line I-I' shown in FIG. 11.
Figure 12B:
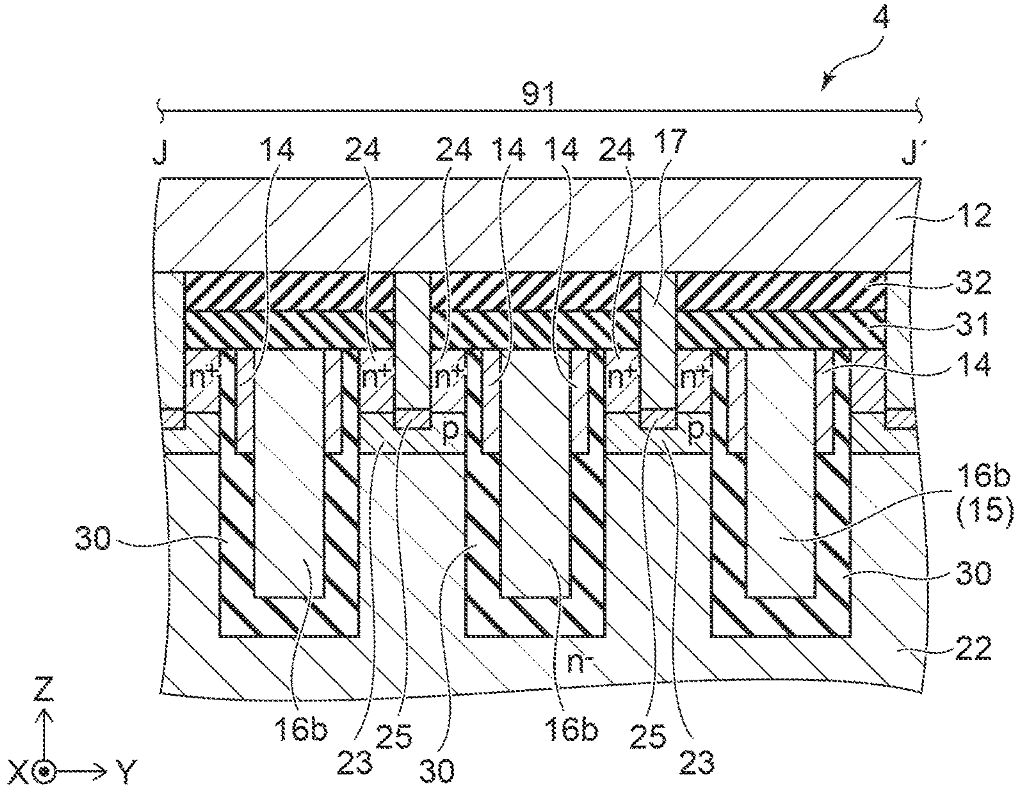
FIG. 12B is a cross-sectional view along line 3-3' shown in FIG. 11.

FIG. 12A is a cross-sectional view along line I-I' shown in FIG. 11; and FIG. 12B is a cross-sectional view along line J-Y shown in FIG. 11.

FIGS. 12A and 12B show only the upper portion of the semiconductor device.

In the semiconductor device 4 according to the embodiment as shown in FIG. 11 and FIGS. 12A and 12B, the conductive member 16 extends to the lower end of the FP electrode 15. Similarly to the third embodiment, the lower portion 16*b* of each conductive member 16 extends in the X-direction; and the lower portion 16*b* of each conductive member 16 is also located in the cell region 91 when viewed along the Z-direction. As a result, the width-direction central portion of the gate electrode 14 is made of the upper portion of the lower portion 16*b* of the conductive member 16; and the entire FP electrode 15 is made of the lower portion of the lower portion 16*b* of the conductive member 16. Thereby, the FP electrode 15 is formed to have a continuous body with the conductive member 16. The upper portion 16*a* of each conductive member 16 is located only in the finger region 92.

According to the embodiment, the resistance of the gate electrode 14 and the FP electrode 15 can be reduced because a portion of the gate electrode 14 and the entire FP electrode 15 are formed of the lower portion 16*b* of the conductive member 16.

According to the embodiment, the two width-direction side portions of the gate electrode 14 are formed of polysilicon; and the FP electrode 15 and the width-direction central portion of the gate electrode 14 are formed of the conductive member 16 that includes a metal. Therefore, a potential difference is generated between the conductive member 16 and the two width-direction side portions of the gate electrode 14 due to the difference between the work function of the polysilicon portion and the work function of the portion including the metal. As a result, a depletion layer spreads in the drift layer 22 with the interface between the insulating member 30 and the drift layer 22 as a starting point; and the electrons at the insulating member 30 vicinity are expelled. Therefore, the electrostatic capacitance between the FP electrode 15 and the drift layer 22 is reduced, and the output capacitance of the semiconductor device 4 also is reduced. Accordingly, when switching the semiconductor device 4, the time necessary to charge and discharge the output capacitance is shorter, and the switching loss of the semiconductor device 4 can be reduced. Otherwise, the configuration and the effects of the embodiment are similar to those of the first embodiment.

According to embodiments described above, a semiconductor device can be realized in which the on-resistance can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

Embodiments include the following aspects.

Note 1

A semiconductor device, comprising:
- a first electrode;
- a semiconductor part located on the first electrode;
- a second electrode located in a first region on the semiconductor part;
- a third electrode located in a second region on the semiconductor part;
- an insulating member located in the semiconductor part in the first and second regions;
- a fourth electrode located in the insulating member in the first and second regions;
- a fifth electrode located in the insulating member between the first electrode and the fourth electrode in the first and second regions; and
- a conductive member located at least in the second region, the conductive member being connected to the third, fourth, and fifth electrodes.

Note 2

The device according to note 1, wherein
the semiconductor part includes:
- a first semiconductor layer connected to the first electrode, the first semiconductor layer being of a first conductivity type;
- a second semiconductor layer located on the first semiconductor layer, the second semiconductor layer being of a second conductivity type; and
- a third semiconductor layer located on a portion of the second semiconductor layer and connected to the second electrode, the third semiconductor layer being of the first conductivity type, the fourth electrode facing the second and third semiconductor layers via a portion of the insulating member,
the fifth electrode facing the first semiconductor layer via an other portion of the insulating member.

Note 3

The device according to note 1 or 2, wherein
the conductive member includes a metal.

Note 4

The device according to any one of notes 1-3, wherein
the conductive member extends through the fourth electrode in a first direction, and
the first electrode and the second electrode are arranged in the first direction.

Note 5

The device according to any one of notes 1-4, wherein pluralities of each of the insulating member, the fourth electrode, the fifth electrode, and the conductive member are provided, the plurality of insulating members is arranged along a second direction, the plurality of fourth electrodes is arranged along the second direction, the plurality of fifth electrodes is arranged along the second direction, the second direction crosses a first direction in which the first electrode and the second electrode are arranged, each of the plurality of insulating members, each of the plurality of fourth electrodes, and each of the plurality of fifth electrodes extend in a third direction crossing the first and second directions, and the plurality of fourth electrodes and the plurality of fifth electrodes have common connections with the third electrode in the second region.

Note 6

The device according to note 5, wherein the plurality of conductive members is not located in the first region.

Note 7

The device according to note 5 or 6, wherein the plurality of conductive members is arranged along the second direction.

Note 8

The device according to note 5 or 6, wherein two of the conductive members connected to two of the fourth electrodes next to each other in the second direction are located at different positions in the third direction.

Note 9

The device according to note 5, wherein lower portions of the plurality of conductive members extend in the third direction, and the lower portions of the plurality of conductive members also are located in the first region.

Note 10

The device according to any one of notes 1-9, wherein the fourth electrode and the fifth electrode include silicon.

Note 11

The device according to any one of notes 1-9, wherein the fifth electrodes are formed to have continuous bodies with the conductive members.

Note 12

The device according to any one of notes 1-11, wherein the second region is located between two of the first regions.

What is claimed is:

1. A semiconductor device, comprising:

a first electrode;

a semiconductor part located on the first electrode;

a second electrode located in a plurality of first regions on the semiconductor part;

a third electrode located in a second region on the semiconductor part;

an insulating member located in the semiconductor part in the plurality of first regions and the second region;

a fourth electrode located in the insulating member in the plurality of first regions and the second region;

a fifth electrode located in the insulating member between the first electrode and the fourth electrode in the plurality of first regions and the second region; and a conductive member located at least in the second region, the conductive member being connected to the third, fourth, and fifth electrodes, wherein the insulating member, the fourth electrode and the fifth electrode extend in a third direction, the plurality of first regions are arranged in the third direction, the second region is located between two of the plurality of first regions in the third direction, wherein pluralities of each of the insulating member, the fourth electrode, the fifth electrode, and the conductive member are provided, the plurality of insulating members is arranged along a second direction, the plurality of fourth electrodes is arranged along the second direction, the plurality of fifth electrodes is arranged along the second direction, the second direction crosses a first direction in which the first electrode and the second electrode are arranged, each of the plurality of insulating members, each of the plurality of fourth electrodes, and each of the plurality of fifth electrodes extend in the third direction crossing the first and second directions, and the plurality of fourth electrodes and the plurality of fifth electrodes have common connections with the third electrode in the second region.

2. The device according to claim 1, wherein the semiconductor part includes:

a first semiconductor layer connected to the first electrode, the first semiconductor layer being of a first conductivity type;

a second semiconductor layer located on the first semiconductor layer, the second semiconductor layer being of a second conductivity type; and a third semiconductor layer located on a portion of the second semiconductor layer and connected to the second electrode, the third semiconductor layer being of the first conductivity type, the fourth electrode facing the second and third semiconductor layers via a portion of the insulating member, the fifth electrode facing the first semiconductor layer via another portion of the insulating member.

3. The device according to claim 1, wherein the conductive member includes a metal.

4. The device according to claim 1, wherein the conductive member extends through the fourth electrode in a first direction, and the first electrode and the second electrode are arranged in the first direction.

5. The device according to claim 1, wherein the plurality of conductive members is not located in the plurality of first regions.

6. The device according to claim 1, wherein the plurality of conductive members is arranged along the second direction.

7. The device according to claim 1, wherein two of the conductive members connected to two of the fourth electrodes next to each other in the second direction are located at different positions in the third direction.

8. The device according to claim 1, wherein lower portions of the plurality of conductive members extend in the third direction, and the lower portions of the plurality of conductive members also are located in the plurality of first regions.

9. The device according to claim 1, wherein the fourth electrode and the fifth electrode include silicon.

10. The device according to claim 1, wherein the fifth electrodes are formed to have continuous bodies with the conductive members.

* * * * *